(12) United States Patent
Hinogami et al.

(10) Patent No.: US 6,514,647 B1
(45) Date of Patent: Feb. 4, 2003

(54) PHOTOMASK, RESIST PATTERN FORMATION METHOD, METHOD OF DETERMINING ALIGNMENT ACCURACY AND METHOD OF FABRICATING SEMICONDUCTOR DEVICE

(75) Inventors: Reiko Hinogami, Osaka (JP); Hisashi Watanabe, Shiga (JP); Hideo Nakagawa, Kyoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 12 days.

(21) Appl. No.: 09/615,744

(22) Filed: Jul. 13, 2000

(30) Foreign Application Priority Data

Jul. 13, 1999 (JP) .......................................... 11-198783

(51) Int. Cl.$^7$ .............................. G03F 9/00; G03C 5/00
(52) U.S. Cl. .............................. 430/22; 430/5; 430/396
(58) Field of Search .............................. 430/5, 22, 30, 430/396

(56) References Cited

U.S. PATENT DOCUMENTS

| | | | | |
|---|---|---|---|---|
| 5,939,226 A | * | 8/1999 | Tomimatu | 430/5 |
| 6,300,018 B1 | * | 10/2001 | Dilley et al. | 430/5 |
| 6,312,874 B1 | * | 11/2001 | Chan et al. | 430/314 |

* cited by examiner

*Primary Examiner*—Mark F. Huff
*Assistant Examiner*—Saleha R. Mohamedolla
(74) *Attorney, Agent, or Firm*—Nixon Peabody LLP; Donald R. Studebaker

(57) ABSTRACT

A photomask of this invention includes a main pattern part for forming a main pattern in a resist film and an alignment mark part for forming, in the resist film, an alignment accuracy determining mark not penetrating the resist film in section after development of the resist film.

6 Claims, 13 Drawing Sheets

Fig. 4(a)
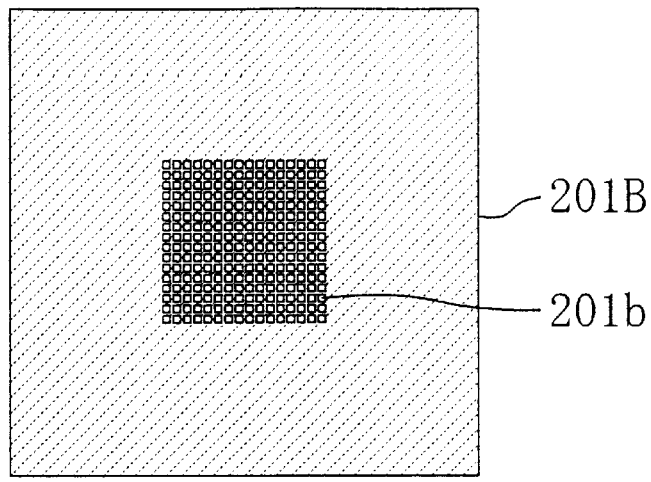
Fig. 4(b)
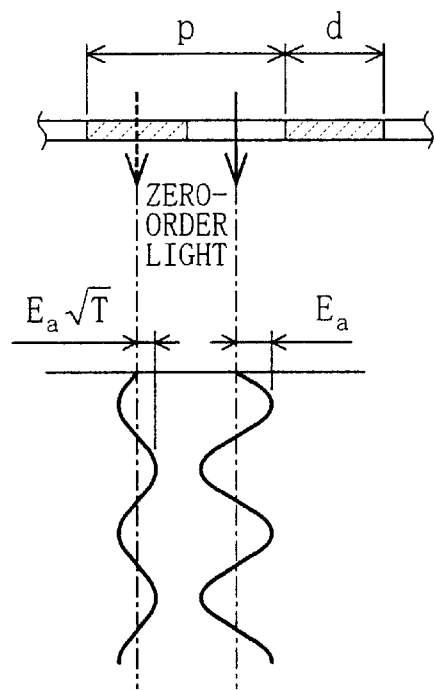
Fig. 4(c)
Fig. 4(d)
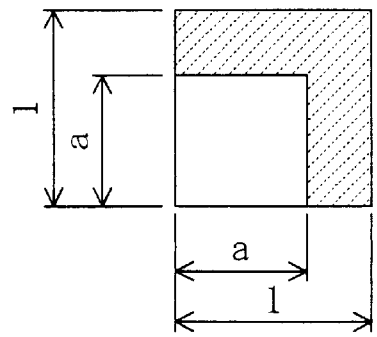

EXPOSING LIGHT

PHOTOMASK, RESIST PATTERN FORMATION METHOD, METHOD OF DETERMINING ALIGNMENT ACCURACY AND METHOD OF FABRICATING SEMICONDUCTOR DEVICE

BACKGROUND OF THE INVENTION

The present invention relates to a photomask used in lithography of semiconductor processing, and a resist pattern formation method, a method of determining alignment accuracy and a method of fabricating a semiconductor device using the photomask.

In the photolithography of semiconductor processing, in order to prevent alignment shift between a lower pattern formed on a lower layer and an upper pattern formed on an upper layer, it is determined whether or not there is alignment shift between a first alignment accuracy determining mark formed on the lower pattern and a second alignment accuracy determining mark formed on a resist pattern used for forming the upper pattern. When the alignment shift of the second alignment accuracy determining mark from the first alignment accuracy determining mark is within an allowable range, the upper layer is etched by using the resist pattern to form the upper pattern. When the alignment shift of the second alignment accuracy determining mark from the first alignment accuracy determining mark is out of the allowable range, the resist pattern is generally formed once again.

Before describing a first conventional method in which a lower portion of a contact hole is formed in a lower interlayer insulating film and an upper portion of the contact hole communicated with the lower portion is formed in an upper interlayer insulating film, the necessity for forming the lower portion of the contact hole in the lower interlayer insulating film and the upper portion thereof in the upper interlayer insulating film will be described as the premise.

In accordance with development in the integration of semiconductor integrated circuits, it is desired to form, in an interlayer insulating film, an opening for a contact hole or a line pattern having a small opening size and a large depth, namely, a high aspect ratio. Therefore, techniques for forming an opening with a high aspect ratio, such as an etching gas and a plasma etching system that can etch the bottom of an opening with a high aspect ratio, have been developed.

A contact hole with a very high aspect ratio, however, cannot be dealt with by the currently developed dry etching technique. Specifically, when the aspect ratio is so high that ions included in plasma cannot reach the bottom of the contact hole, the bottom of the contact hole cannot be etched even by conducting dry etching over infinitive etching time. In other words, there is a limit aspect ratio at which the etching cannot be carried out even through the dry etching conducted over infinitive etching time. For example, in the currently employed dry etching technique, the limit aspect ratio is approximately 6. Specifically, when a contact hole has an opening size of 0.2 μm, the limit of the depth of the hole that can be dry etched is approximately 1.8 μm. Therefore, a contact hole having an opening size of 0.2 μm cannot be formed into a depth larger than 1.8 μm by the current etching technique.

On the other hand, in order to meet the demands for further refinement of semiconductor integrated circuits, it is desired to form a contact hole with a depth beyond the limit aspect ratio in an interlayer insulating film.

Therefore, the aforementioned method is required, in which an interlayer insulating film is dividedly deposited as a lower inter layer insulating film and an upper interlayer insulating film, and contact holes each having a depth below the limit aspect ratio are formed in the same position in the lower interlayer insulating film and the upper interlayer insulating film, so as to form one contact hole from the lower contact hole formed in the lower interlayer insulating film and the upper contact hole formed in the upper interlayer insulating film. In this case, the thicknesses of the lower and upper interlayer insulating films are set so that the aspect ratios of the contact holes respectively formed therein can be lower than the limit aspect ratio.

Now, the first conventional method will be described with reference to FIGS. 11(a) through 11(c) and 12(a) through 12(c). In each of FIGS. 11(a), 11(c) and 12(a) through 12(c), a portion on the right hand side of break lines corresponds to a main pattern region (element formation region) where line patterns and contact holes are to be formed, and a portion on the left hand side of the break lines corresponds to an alignment accuracy determining mark region where alignment accuracy determining marks are to be formed.

First, as is shown in FIG. 11(a), a line pattern 12 of a metal line or a gate electrode is formed on an underlying insulating film 11 formed on a semiconductor substrate 10. In this case, a first alignment accuracy determining mark 13 in a concave shape is formed in the line pattern 12. Next, after depositing a lower interlayer insulating film 14 on the line pattern 12, a first resist film is formed on the lower interlayer insulating film 14, and the first resist film is exposed by using a photomask 15 and developed, thereby forming a first resist pattern 16. In the first resist pattern 16, a second alignment accuracy determining mark 17 in a convex shape having a smaller plane area than the first alignment accuracy determining mark 13 is formed in a position corresponding to the first alignment accuracy determining mark 13.

Then, as is shown in FIG. 11(b), it is determined whether or not there is alignment shift of the second alignment accuracy determining mark 17 from the first alignment accuracy determining mark 13. In the determination of the alignment shift, the shapes of the line pattern 12 and the first resist pattern 16 can be recognized by observing the top face of the semiconductor substrate 10 with an optical measurement apparatus because the lower interlayer insulating film 14 is transparent in a visible radiation region. Accordingly, the distance in the X direction and the Y direction between the edges of the first alignment accuracy determining mark 13 and the second alignment accuracy determining mark 17 (i.e., the alignment shift) can be thus measured, so as to determine whether or not the alignment shift of the second alignment accuracy determining mark 17 from the first alignment accuracy determining mark 13 is within an allowable range.

When it is determined that the alignment shift of the second alignment accuracy determining mark 17 from the first alignment accuracy determining mark 13 is within the allowable range, the lower interlayer insulating film 14 is etched by using the first resist pattern 16 as a mask, so as to form a contact lower portion 19 by forming a lower portion 18 of a contact hole in the lower interlayer insulating film 14 and filling a first metal film within the lower portion 18 of the contact hole as is shown in FIG. 11(c). In this case, in the alignment accuracy determining mark region, an opening is formed in a peripheral portion of the second alignment accuracy determining mark 17 in the lower interlayer insulating film 14, namely, in a peripheral portion of the first alignment accuracy determining mark 13, and hence, the first metal film 20 is filled within this opening.

Next, as is shown in FIG. 12(a), after depositing an upper interlayer insulating film 21 on the lower interlayer insulating film 14, a second resist film is formed on the upper interlayer insulating film 21. Then, the second resist film is exposed by using the same photomask 15 and developed, thereby forming a second resist pattern 22. Also in this case, in the second resist pattern 22, a third alignment accuracy determining mark 23 in a convex shape with the same size as the second alignment accuracy determining mark 17 is formed.

Since the first metal film 20 is filled in the peripheral portion of the first alignment accuracy determining mark 13 as described above, however, the edge of the first alignment accuracy determining mark 13 cannot be recognized by observing the top face of the semiconductor substrate 10 with an optical measurement apparatus. Therefore, the alignment shift of the third alignment accuracy determining mark 23 from the first alignment accuracy determining mark 13 cannot be thus measured.

Therefore, inevitably, without determining whether or not the alignment shift of the third alignment accuracy determining mark 23 from the first alignment accuracy determining mark 13 is within the allowable range, the upper interlayer insulating film 21 is etched by using the second resist pattern 22 as a mask, so as to form a contact. upper. portion 25 by forming an upper portion 24 of the contact hole in the upper interlayer insulating film 21 and filling a second metal film within the upper portion 24 of the contact hole. In this case, the second metal film 26 is also filled in a peripheral portion of the third alignment accuracy determining mark 23 in the upper interlayer insulating film 21.

Now, a second conventional method in which a contact hole is formed in a lower interlayer insulating film deposited on a lower line pattern and a line groove communicating with the contact hole is formed in an upper interlayer insulating film will be described with reference to FIGS. 13(a) through 13(d). In each of FIGS. 13(a) through 13(d), a portion on the right hand side of break lines corresponds to a main pattern region (element formation region) where line patterns and contact holes are to be formed, and a portion on the left hand side of the break lines corresponds to an alignment accuracy determining mark region where alignment accuracy determining marks are to be formed.

First, as is shown in FIG. 13(a), a line pattern 32 of a metal line or a gate electrode is formed on an underlying insulating film 31 formed on a semiconductor substrate 30. In this case, in the line pattern 32, a first alignment accuracy determining mark 33 in a concave shape is formed. Next, after depositing a lower interlayer insulating film 34 on the line pattern 32, a first resist film is formed on the lower interlayer insulating film 34, and the first resist film is exposed by using a first photomask 35 and developed, thereby forming a first resist pattern 36. In the first resist pattern 36, a second alignment accuracy determining mark 37 in a convex shape having a smaller plane area than the first alignment accuracy determining mark 33 is formed in a position corresponding to the first alignment accuracy determining mark 33, and an island portion 38 having substantially the same plane shape as the first alignment accuracy determining mark 33 is formed in a position different from the second alignment accuracy determining mark 37.

Next, it is determined whether or not the alignment shift of the second alignment accuracy determining mark 37 from the first alignment accuracy determining mark 33 is within an allowable range in the same manner as in the first conventional method. When it is determined that the alignment shift of the second alignment accuracy determining mark 37 from the first alignment accuracy determining mark 33 is within the allowable range, the lower interlayer insulating film 34 is etched by using the first resist pattern 36 as a mask, so as to form a contact 40 by forming a contact hole 39 in the lower interlayer insulating film 34 and filling a first metal film within the contact hole 39 as is shown in FIG. 13(b).

In this case, since an opening is formed in a peripheral portion of the first alignment accuracy determining mark 33 in the alignment accuracy determining mark region, the first metal film 41 is filled within the opening. Owing to the island portion 38 formed in the first resist pattern 36, however, a third alignment accuracy determining mark 42 in a concave shape is formed in the first metal film 41.

Next, as is shown in FIG. 13(c), after depositing an upper interlayer insulating film 43 on the lower interlayer insulating film 34, a second resist film is formed on the upper interlayer insulating film 43, and the second resist film is exposed by using a second photomask 44 and developed, thereby forming a second resist pattern 45. A fourth alignment accuracy determining mark 46 in a convex shape having a smaller plane area than the third alignment accuracy determining mark 42 is formed in the second resist pattern 45 in a position corresponding to the third alignment accuracy determining mark 42.

Then, it is determined whether or not the alignment shift of the fourth alignment accuracy determining mark 46 from the third alignment accuracy determining mark 42 is within an allowable range in the same manner as in the first conventional method. When it is determined that the alignment shift of the fourth alignment accuracy determining mark 46 from the third alignment accuracy determining mark 42 is within the allowable range, the upper interlayer insulating film 43 is etched by using the second resist pattern 45 as a mask, so as to form a buried line 48 by forming a line groove 47 in the upper interlayer insulating film 43 and filling a second metal film within the line groove 47 as is shown in FIG. 13(d).

The first and second conventional methods have, however, the following problems: In the first conventional method, since the upper interlayer insulating film 21 is etched by using the second resist pattern 22 without the determination of the alignment shift of the third alignment accuracy determining mark 23 from the first alignment accuracy determining mark 13. Accordingly, as is shown in FIG. 12(c), the upper portion 24 of the contact hole formed in the upper interlayer insulating film 21 can be shifted in the position from the lower portion 18 of the contact hole formed in the lower interlayer insulating film 14, resulting in causing alignment shift of the contact upper portion 25 from the contact lower portion 19. Due to this alignment shift, problems such as a large resistance value and disconnection can occur in the contact formed from the contact lower portion 19 and the contact upper portion 25.

In the second conventional method, although the alignment shift is not caused between the buried line 48 and the contact 40, it is necessary to form the second alignment accuracy determining mark 37 in the position corresponding to the first alignment accuracy determining mark 33 and to form the fourth alignment accuracy determining mark 46 in the position corresponding to the third alignment accuracy determining mark 42. Accordingly, the alignment accuracy determining mark region occupies a large area, which reduces the area occupied by the main pattern region in the photomask.

As described above, in the case where plural resist patterns are formed through plural pattern exposure by using the same photomask as in the first conventional method, there arises a problem that the alignment shift of the resist pattern formed through the second or later pattern exposure cannot be determined. Furthermore, in the case where plural resist patterns are formed through pattern exposure by using different photomasks as in the second conventional method, there arises a problem that the area of the alignment accuracy determining mark region is large because the positions of alignment accuracy determining marks should be changed in the respective photomasks.

Through examination of the problems of the first and second conventional methods, the following common problem can be found in these conventional methods: An alignment accuracy determining mark formed in a first conductive film pattern made from a first conductive film (corresponding to the line pattern 12 in the first conventional method or the line pattern 32 in the second conventional method) can be used for the determination of alignment shift of a resist pattern for forming a second conductive film pattern from a second conductive film (corresponding to the contact lower portion 19 in the first conventional method or the contact 39 in the second conventional method) but cannot be used for the determination of alignment shift of a resist pattern for forming a third conductive film pattern from a third conductive film (corresponding to the contact upper portion 25 in the first conventional method or the buried line 48 in the second conventional method).

In other words, the first conventional method and the second conventional method have a common problem that an alignment accuracy determining mark formed in a lower conductive film pattern cannot be used plural times.

SUMMARY OF THE INVENTION

In consideration of the aforementioned conventional problems, an object of the invention is allowing an alignment accuracy determining mark formed in a lower conductive film pattern to be used plural times, and specifically, allowing an alignment accuracy determining mark formed in a first conductive film pattern made from a first conductive film to be used not only in determination of alignment shift of a resist pattern for forming a second conductive film pattern from a second conductive film but also in determination of alignment shift of a resist pattern for forming a third conductive film pattern from a third conductive film.

In order to achieve the object, according to the invention, an alignment accuracy determining mark not penetrating a resist film in section after development is formed in the resist film, so that an alignment accuracy determining mark formed in a lower conductive film pattern cannot be buried in a conductive film.

Specifically, the photomask of this invention for use in forming a resist pattern from a resist film comprises a main pattern part for forming a main pattern in the resist film; and an alignment mark part for forming, in the resist film, an alignment accuracy determining mark not penetrating the resist film in section after development of the resist film.

When a resist pattern is formed by subjecting a resist film to pattern exposure using the photomask of the invention and development, an alignment accuracy determining mark not penetrating the resist film in section is formed in the resist pattern. Therefore, when an insulating film is etched by using the resist pattern, no opening is formed in the insulating film in a position corresponding to the alignment accuracy determining mark. Accordingly, when an upper conductive film is deposited on the insulating film, the upper conductive film is not filled in the insulating film in the position corresponding to the alignment accuracy determining mark of the resist pattern, so that the alignment accuracy determining mark formed in the lower conductive film can be optically observed. In other words, the alignment accuracy determining mark formed in the lower conductive film can be optically observed even after depositing the upper conductive film on the insulating film. As a result, the alignment accuracy determining mark formed in the lower conductive film can be used again in determining alignment shift of a resist pattern for patterning an insulating film deposited on the upper conductive film.

In the photomask of the invention, the alignment mark part preferably has a fine opening pattern with an opening width smaller than a resolution limit of exposing light.

In this manner, an alignment accuracy determining mark in a concave shape can be formed in the resist film after development. Therefore, when an insulating film is etched by using a resist pattern formed from the developed resist film, neither an opening is formed nor a conductive film is filled in the insulating film in the position corresponding to the alignment accuracy determining mark of the resist pattern. Accordingly, the alignment accuracy determining mark formed in the conductive film pattern below the insulating film can be optically observed.

In the photomask of this invention, the main pattern part is preferably made from a halftone type phase shift mask, and the alignment mark part preferably includes a phase shift mask region where plural non-shield portions for transmitting exposing light with no attenuation and causing no phase difference and plural shield portions for transmitting the exposing light with causing attenuation and phase inversion are alternately formed.

In this manner, an alignment accuracy determining mark having a step portion can be formed in the developed resist film on the basis of a difference in energy between light passing through the phase shift mask region and light passing through a peripheral portion of the phase shift mask region. Accordingly, when an insulating film is etched by using a resist pattern formed from the developed resist film, neither an opening is formed nor an upper conductive film is filled in the insulating film in the position corresponding to the alignment accuracy determining mark of the resist pattern. As a result, the alignment accuracy determining mark formed in the lower conductive film can be optically observed.

In the photomask of this invention, the main pattern part is preferably made from a halftone type phase shift mask, and the alignment mark part preferably includes a shield film formed on the halftone type phase shift mask.

In this manner, an alignment accuracy determining mark having a step portion can be formed in the developed resist film on the basis of a difference in energy between light passing through the shield film formed in the halftone type photomask and light passing through a peripheral portion of the shield film. Accordingly, when an insulating film is etched by using a resist pattern formed from the developed resist film, neither an opening is formed nor an upper conductive film is filled in the insulating film in the position corresponding to the alignment accuracy determining mark of the resist pattern. As a result, the alignment accuracy determining mark formed in the lower conductive film can be optically observed.

The resist pattern formation method of this invention comprises the steps of forming a resist film on an insulating film formed on a conductive film pattern having a first alignment accuracy determining mark in an alignment mark formation region different from an element formation region; and forming a main pattern in the element formation region of the resist film by irradiating the resist film with exposing light through a photomask and developing the resist film after irradiation, and forming a second alignment accuracy determining mark not penetrating, in section, the resist film in the alignment mark formation region of the resist film.

According to the resist pattern formation method of this invention, an alignment accuracy determining mark not penetrating a resist film in section is formed in an alignment mark formation region of the resist film. Therefore, when an insulating film is etched by using a resist pattern formed from the resist film, no opening is formed in the insulating film in a position corresponding to the alignment accuracy determining mark. Accordingly, when an upper conductive film is deposited on the insulating film, the upper conductive film is not filled in the insulating film in the position corresponding to the alignment accuracy determining mark of the resist pattern, so that the alignment accuracy determining mark formed in the lower conductive film can be optically observed. In other words, even after depositing the upper conductive film on the insulating film, the alignment accuracy determining mark formed in the lower conductive film can be optically observed. As a result,the alignment accuracy determining mark formed in the lower conductive film can be used again in determining alignment shift of a resist pattern for patterning an insulating film deposited on the upper conductive film.

In the resist pattern formation method of this invention, the second alignment accuracy determining mark preferably has a plane shape smaller than a plane shape of the first alignment accuracy determining mark and is preferably formed in an internal area of the first alignment accuracy determining mark when seen from above.

In this manner, the relationship in position between the first alignment accuracy determining mark and the second alignment accuracy determining mark can be optically measured, and hence, the alignment shift of the second alignment accuracy determining mark from the first alignment accuracy determining mark can be definitely determined.

In the resist pattern formation method of this invention, the second alignment accuracy determining mark is preferably made from a concave portion formed in the resist film.

In this manner, when an insulating film is etched by using a resist pattern formed from the developed resist film, neither an opening is formed nor an upper conductive film is filled in the insulating film in the position corresponding to the alignment accuracy determining mark of the resist pattern. As a result, the alignment accuracy determining mark formed in the lower conductive film can be optically observed.

In the resist pattern formation method, the second alignment accuracy determining mark preferably includes a step portion formed in the resist film.

In this manner, when an insulating film is etched by using a resist pattern formed from the developed resist film, neither an opening is formed nor an upper conductive film is filled in the insulating film in the position corresponding to the alignment accuracy determining mark of the resist pattern. As a result, the alignment accuracy determining mark formed in the lower conductive film can be optically observed.

The method of determining alignment accuracy of this invention comprises the steps of forming a resist film on an insulating film formed on a conductive film pattern having a first alignment accuracy determining mark in an alignment mark formation region different from an element formation region; forming a main pattern in the element formation region of the resist film by irradiating the resist film with exposing light through a photomask and developing the resist film after irradiation, and forming a second alignment accuracy determining mark not penetrating, in section, the resist film in the alignment mark formation region of the resist film; and determining alignment shift of the second alignment accuracy determining mark from the first alignment accuracy determining mark by optically determining a relationship in position between the first alignment accuracy determining mark and the second alignment accuracy determining mark.

According to the method of determining alignment accuracy of this invention, an alignment accuracy determining mark not penetrating a resist film in section is formed in an alignment mark formation region of the resist film. Therefore, when an insulating film is etched by using a resist pattern formed from the resist film, no opening is formed in a position of the resist film corresponding to the alignment accuracy determining mark. Accordingly, when an upper conductive film is deposited on the insulating film, the upper conductive film is not filled in the insulating film in the position corresponding to the alignment accuracy determining mark of the resist pattern, so that the alignment accuracy determining mark formed in the lower conductive film can be optically observed. As a result, alignment shift of the second alignment accuracy determining mark from the first alignment accuracy determining mark can be definitely determined by optically measuring the relationship in position between the first alignment accuracy determining mark and the second alignment accuracy determining mark.

The method of fabricating a semiconductor device of this invention comprises the steps of forming, on a semiconductor substrate, a first conductive film pattern having a first alignment accuracy determining mark from a first conductive film; forming a first insulating film on the first conductive film pattern; forming a first resist film on the first insulating film; forming, from the first resist film, a first resist pattern having a second alignment accuracy determining mark not penetrating, in section, the first resist film in a position corresponding to the first alignment accuracy determining mark by irradiating the first resist film with exposing light through a first photomask and developing the first resist film after irradiation; optically determining alignment shift of the second alignment accuracy determining mark from the first alignment accuracy determining mark, and when the alignment shift is within an allowable range, forming a first insulating film pattern from the first insulating film by etching the first insulating film by using the first resist pattern as a mask; forming a second conductive film pattern from a second conductive film deposited on the first insulating film pattern; forming a second insulating film on the second conductive film pattern; forming a second resist film on the second insulating film; forming, from the second resist film, a second resist pattern having a third alignment accuracy determining mark not penetrating, in section, the second resist film in a position corresponding to the first alignment accuracy determining mark by irradiating the second resist film with exposing light through a second photomask and developing the second resist film after irradiation; optically determining alignment shift of the third alignment accuracy determining mark from the first alignment accuracy determining mark, and when the alignment shift is within an allowable range, forming a second insulating film pattern from the second insulating film by etching the second insulating film by using the second resist pattern as a mask; and forming a third conductive film pattern from a third conductive film deposited on the second insulating film pattern.

According to the method of fabricating a semiconductor device of this invention, the alignment shift of the first resist pattern is determined by optically measuring the alignment shift of the second alignment accuracy determining mark from the first alignment accuracy determining mark, and the alignment shift of the second resist pattern is determined by optically measuring the alignment shift of the third alignment accuracy determining mark from the first alignment accuracy determining mark. As a result, the second alignment accuracy determining mark and the third alignment accuracy determining mark can be formed in substantially the same position.

Accordingly, one and the same mask can be used as the first photomask and the second photomask. Also, when the first photomask and the second photomask are different from each other, the area occupied by the alignment accuracy determining mark region in each of the first and second photomasks can be reduced, so that the area occupied by the main pattern region of each photomask can be increased.

In the method of fabricating a semiconductor device, preferably, the first photomask has an opening for forming a contact hole, the second photomask has an opening for forming a line groove, a contact hole is formed in the first insulating film pattern, the second conductive film pattern includes a contact formed in the contact hole, a line groove communicated with the contact hole is formed in the second insulating film pattern, and the third conductive film includes a buried line formed in the line groove.

In this manner, the area occupied by the main pattern region in the photomask used for forming a multilayered line having a damascene structure can be increased.

Preferably in the method of fabricating a semiconductor device, preferably, the first photomask and the second photomask are the same mask having an opening for forming a contact hole, a lower portion of a contact hole is formed in the first insulating film pattern, the second conductive film pattern includes a contact lower portion formed in the lower portion of the contact hole, an upper portion of the contact hole communicating with the lower portion of the contact hole is formed in the second insulating film pattern, and the third conductive film pattern includes a contact upper portion formed in the upper portion of the contact hole.

In this manner, a contact hole having a depth beyond the limit aspect ratio can be formed by using the same photomask without causing alignment shift between the lower portion of the contact hole formed in the first insulating pattern and the upper portion of the contact hole formed in the second insulating pattern.

BRIEF DESCRIPTION OF THE DRAWINGS

FIG. 4(a) is an enlarged plan view of an alignment mark part of the photomask of Embodiment 2;

FIGS. 4(b) and 4(c) are diagrams for illustrating behavior of light passing through a non-shield portion and a shield portion formed in a phase shift mask region of the alignment mark part;

FIG. 4(d) is a diagram for illustrating the size of the shield portion formed in the phase shift mask region of the alignment mark part;

DETAILED DESCRIPTION OF THE INVENTION

Embodiment 1

A photomask according to Embodiment 1 of the invention will now be described with reference to FIGS. 1(a) through 1(d). In each of FIGS. 1(a) through 1(d), a portion on the right hand side of break lines corresponds to a main pattern region (element formation region) where line patterns and contact holes are to be formed, and a portion on the left hand side of the break lines corresponds to an alignment accuracy determining mark region where alignment accuracy determining marks are to be formed.

Figure 1A:
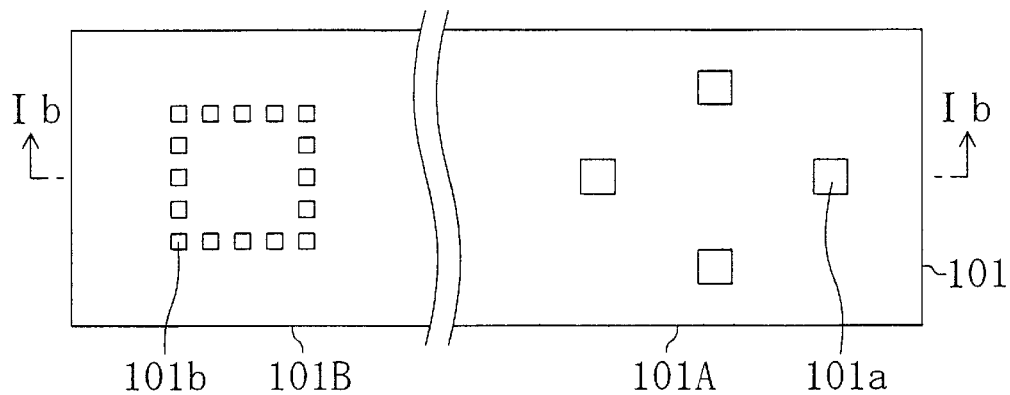
FIG. 1(a) is a plan view of a photomask according to Embodiment 1 of the invention.
Figure 1B:
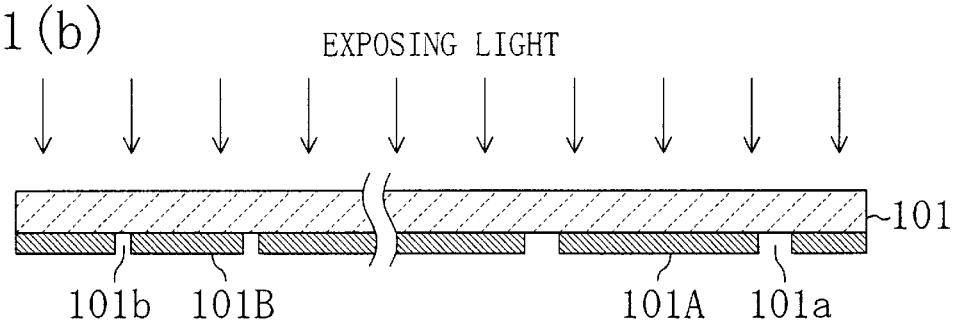
FIG. 1(b) is a sectional view taken on line Ib—Ib of FIG. 1(a)
Figure 1C:
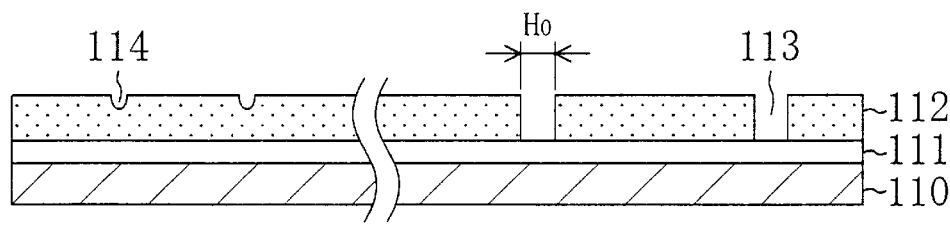
FIG. 1(c) is a sectional view of a resist pattern formed by using the photomask of Embodiment 1.
Figure 1D:
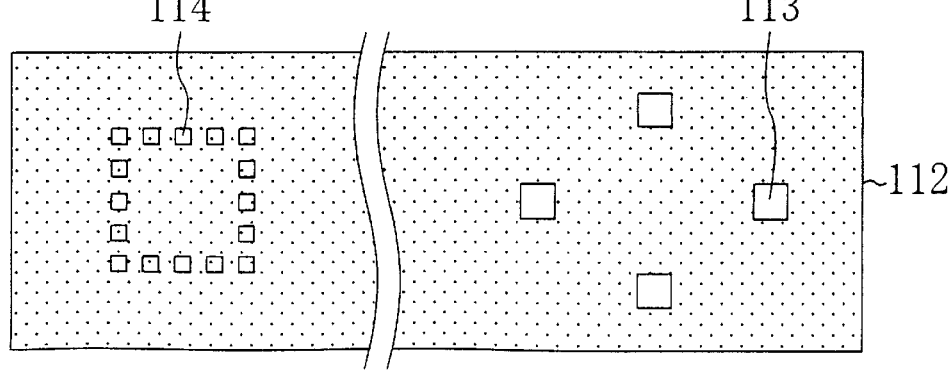
FIG. 1(d) is a plan view of the resist pattern formed by using the photomask of Embodiment 1.

FIG. 1(a) shows the plane structure of a photomask 101 of Embodiment 1, FIG. 1(b) shows the sectional structure taken on line Ib—Ib of FIG. 1(a), FIG. 1(c) shows the sectional structure of a resist pattern formed by using the photomask 101, and FIG. 1(d) shows the plane structure of the resist pattern formed by using the photomask 101.

As is shown in FIGS. 1(a) and 1(b), the photomask 101 includes a main pattern part 101A for forming a main pattern in a resist film and an alignment mark part 101B for forming, in the resist film through development, an alignment accuracy determining mark not penetrating the resist film in section.

In the main pattern part 101A, a contact hole forming opening 101a for forming a contact hole in the resist film is formed, and in the alignment mark part 101B, small openings 101b each having an opening size (a minimum width) smaller than the resolution limit (imaging limit) of exposing light are formed to be arranged in the form of a rectangular frame. Although the contact hole forming opening 101a is formed in the main pattern part 101A in Embodiment 1, a line groove forming opening for forming a line groove can be formed instead.

As is shown in FIG. 1(c), a resist film 112 is formed on an etched film 111 deposited on a semiconductor substrate 110. The resist film 112 is irradiated with exposing light through the photomask 101 of Embodiment 1 for pattern exposure, and the resist film 112 is developed after the pattern exposure. Thus, as is shown in FIGS. 1(c) and 1(d), a contact hole 113 is formed in the main pattern region of the resist film 112 and an alignment accuracy determining mark 114 in a rectangular frame shape not penetrating the resist film 112 in section is formed in the alignment accuracy determining mark region of the resist film 112.

The opening size of the small opening 101b formed in the photomask 101 depends upon the conditions for the processing, and when the minimum size $H_0$ of the contact hole 113 formed in the main pattern region is 0.2 μm, the opening size of the small opening 101b is preferably approximately 60% through 90% of the minimum size $H_0$. This is for the following reason: When the opening size of the small opening 101b formed in the photomask 101 is smaller than 60% of the minimum size $H_0$ of the contact hole 113, the alignment mark part 101B is scarcely transferred onto the resist film 112, and hence, the resultant alignment accuracy determining mark 114 is difficult to recognize with an optical measurement apparatus. On the other hand, when the opening size of the small opening 101b formed in the photomask 101 exceeds 90% of the minimum size $H_0$ of the contact hole 113, the alignment accuracy determining mark 114 cannot be formed in the shape of a concave groove but formed as an opening penetrating the resist film 112 in section, so that an opening can be formed in the alignment accuracy determining mark region of the etched film 111 through etching.

Figure 2A:
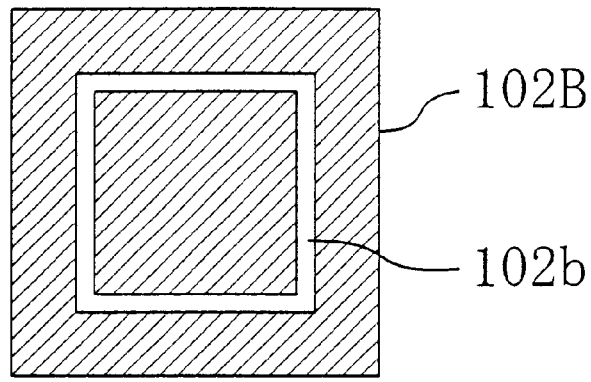
FIG. 2(a) is a plan view of a photomask according to a first modification of Embodiment 1.

FIG. 2(a) shows the plane structure of an alignment mark part 102B of a photomask according to a first modification of Embodiment 1, and a rectangular frame-like space pattern 102b with an opening size smaller than the resolution limit of exposing light is formed in the alignment mark part 102B. Also in this manner, the alignment accuracy determining mark 114 in a rectangular frame-like concave groove shape not penetrating the resist film 112 in section can be formed in the alignment accuracy determining mark region of the resist film as in Embodiment 1.

Figure 2B:
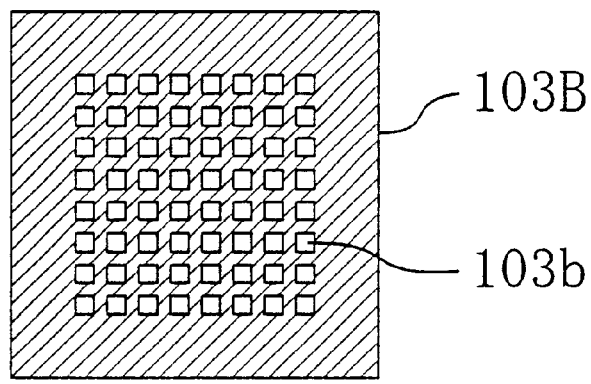
FIG. 2(b) is a plan view of a photomask according to a second modification of Embodiment 1.

FIG. 2(b) shows the plane structure of an alignment mark part 103B of a photomask according to a second modification of Embodiment 1, and small openings 103b each having an opening size smaller than the resolution limit of exposing light are formed to be arranged in the form of an array in the alignment mark part 103B. Also in this manner, although not shown in the drawing, an alignment accuracy determining mark in a rectangular frame-like concave shape not penetrating the resist film 112 in section can be formed in the alignment accuracy determining mark region of the resist film 112.

Figure 2C:
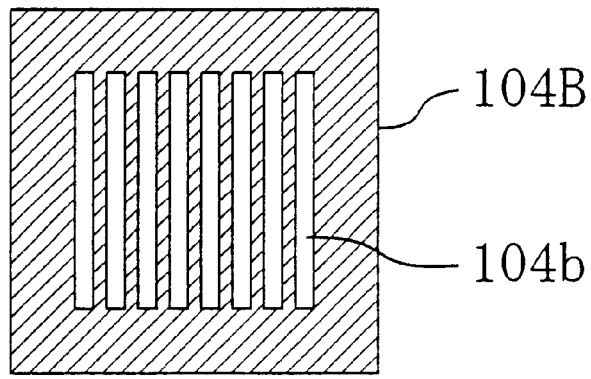
FIG. 2(c) is a plan view of a photomask according to a third modification of Embodiment 1.

FIG. 2(c) shows the plane structure of an alignment mark part 104B of a photomask according to a third modification of Embodiment 1, and a line and space pattern 104b for allowing zero-order interference light alone to enter a collective lens of a pattern exposure system is formed in the alignment mark part 104B. Also in this manner, analignment accuracy determining mark in a rectangular frame-like concave shape not penetrating the resist film 112 in section can be formed in the alignment accuracy determining mark region of the resist film 112. In this case, the zero-order interference light alone is allowed to enter the collective lens for the following reason: If first-order interference light also enters the collective lens, the energy of light reaching the resist film 112 is greatly increased, so as to form an alignment accuracy determining mark partially penetrating (incompletely penetrating) the resist film 112.

Embodiment 2

A photomask according to Embodiment 2 of the invention will now be described with reference to FIGS. 3(a) through 3(d), 4(a) through 4(d) and 5(a) through 5(c). In each of FIGS. 3(a) through 3(d), a portion on the right hand side of break lines corresponds to a main pattern region (element formation region) where line patterns and contact holes are to be formed, and a portion on the left hand side of the break lines corresponds to an alignment accuracy determining mark region where alignment accuracy determining marks are to be formed.

Figure 3A:
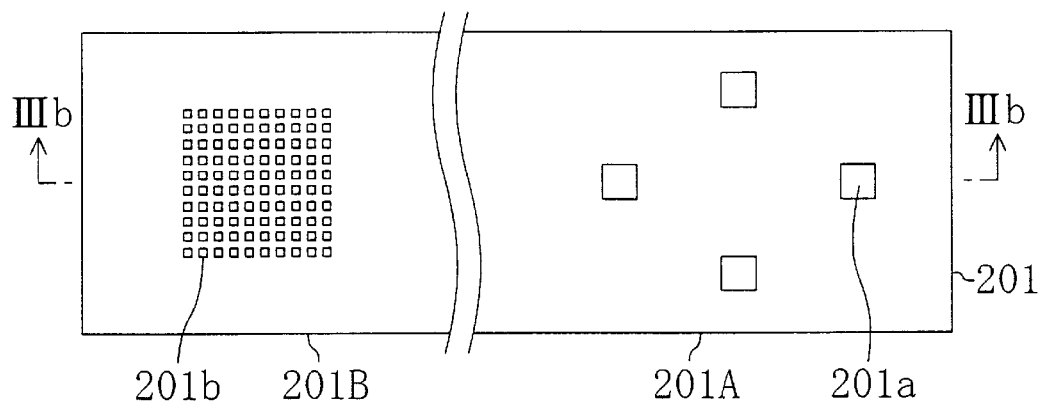
FIG. 3(a) is a plan view of a photomask according to Embodiment 2.
Figure 3B:
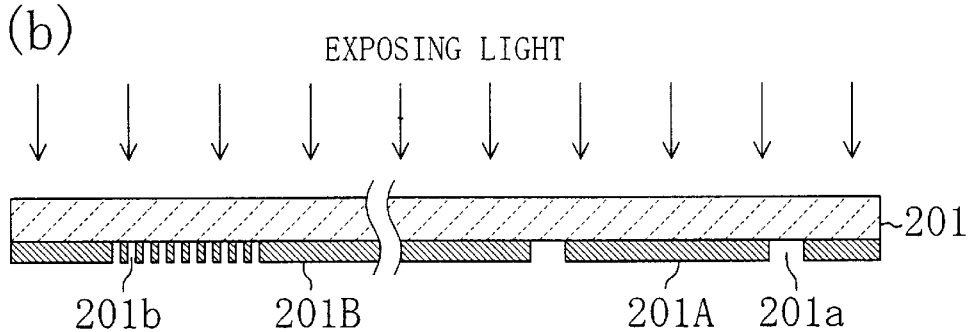
FIG. 3(b) is a sectional view taken on line IIIb—IIIb of FIG. 3(a)
Figure 3C:
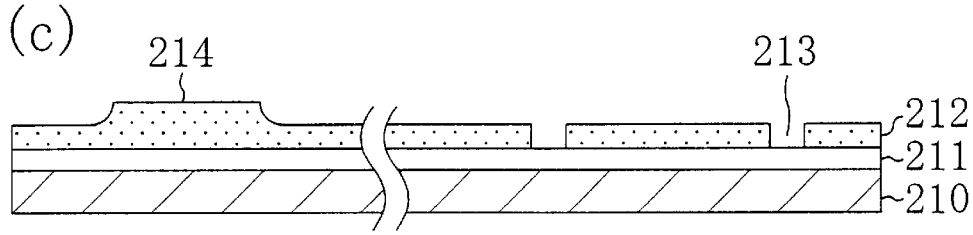
FIG. 3(c) is a sectional view of a resist pattern formed by using the photomask of Embodiment 2.
Figure 3D:
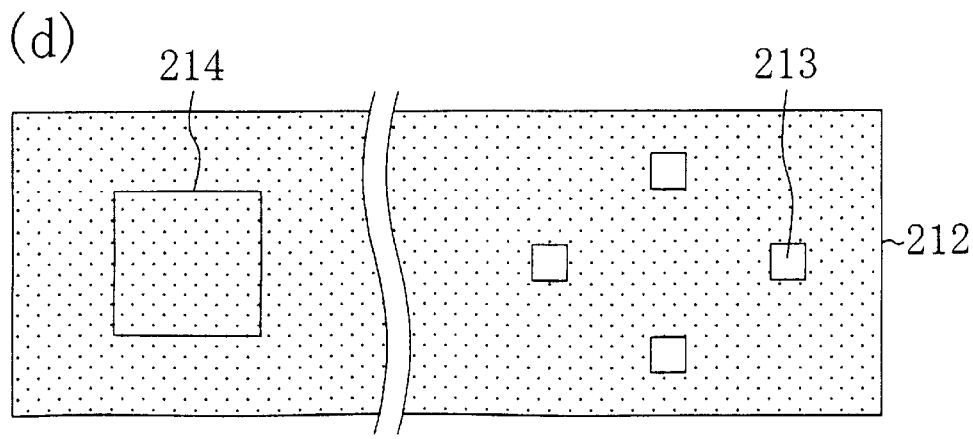
FIG. 3(d) is a plan view of the resist pattern formed by using the photomask of Embodiment 2.

FIG. 3(a) shows the plane structure of a photomask 201 of Embodiment 2, FIG. 3(b) shows the sectional structure taken on line IIIb—IIIb of FIG. 3(a), FIG. 3(c) shows the sectional structure of a resist pattern formed by using the photomask 201, and FIG. 3(d) shows the plane structure of the resist pattern formed by using the photomask 201.

The photomask 201 is made from a halftone type phase shift mask, and as is shown in FIGS. 3(a) and 3(b), includes a main pattern part 201A for forming a main pattern in a resist film and an alignment mark part 201B for forming, in the resist film through development, an alignment accuracy determining mark in a convex shape.

The main pattern part 201A is made from a halftone phase shift mask, and a contact hole forming opening 201a for forming a contact hole in the resist is formed in the main pattern part 201A. Although the contact hole forming opening 201a is formed in the main pattern part 201A of Embodiment 2, a line groove forming opening for forming a line groove can be formed instead.

Figure 5A:
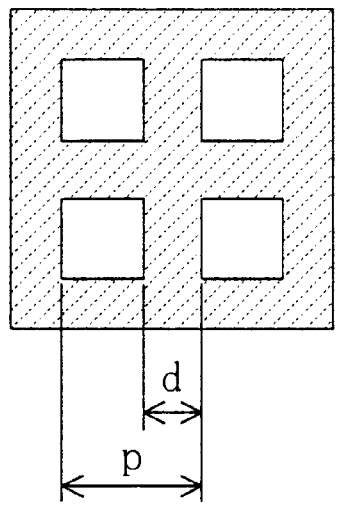
FIGS. 5(a) through 5(c) are partial plan views of the phase shift mask region of the alignment mark part of the photomask of Embodiment 2.

In the alignment mark part 201B, a phase shift mask region 201b is formed, and in the phase shift mask region 201b, plural non-shield portions (corresponding to portions without hatching in FIGS. 4(a), 4(b) and 5(a)) for transmitting incident light with causing substantially no attenuation and no phase difference and plural shield portions (corresponding to portions hatched with broken lines in FIGS. 4(a), 4(b) and 5(a)) for transmitting incident light with causing attenuation and a phase difference of 180 degrees are alternately formed at a pitch p.

As is shown in FIG. 3(c), a resist film 212 is formed on an etched film 211 deposited on a semiconductor substrate 210. The resist film 212 is irradiated with exposing light through the photomask 201 of Embodiment 2 for pattern exposure, and is developed after the pattern exposure. Thus, as is shown in FIGS. 3(c) and 3(d), a contact hole 213 is formed in the main pattern region of the resist film 212 and an alignment accuracy determining mark 214 in a convex shape having a step portion in the periphery is formed in the alignment accuracy determining mark region of the resist film 212.

When the wavelength of the exposing light is indicated as $\lambda$, the coherent ratio of the exposing light is indicated as $\sigma$ and the numerical aperture of a collective lens is indicated as NA, the maximum pitch $p_{MAX}$ at which no interference is caused between light passing through the non-shield portion and light passing through the shield portion is represented as follows:

$$p_{MAX} = \lambda(NA + NA\sigma)$$

Specifically, when the pitch p of the non-shield portion and the shield portion is smaller than the maximum pitch $p_{MAX}$, zero-order interference light alone can reach the resist film.

FIG. 4(c) shows the amplitude $E_a$ and the phase of the light passing through the non-shield portion (shown with a solid arrow) and the amplitude $E_a \times \sqrt{T}$ (wherein T is the transmittance of the shield portion) and the phase of the light passing through the shield portion. The light passing through the non-shield portion and the light passing through the shield portion have thus opposite phases.

When the ratio of the width d of the non-shield portion to the pitch p is indicated as a (=d/p) as shown in FIG. 4(d), the light reaching the resist film 212 is a standing wave with an amplitude E represented by the following Formula 1:

$$E = 1 \times a^2 \times E_a - \sqrt{T} \times (1-a^2) \times E_a \qquad \text{Formula 1:}$$

When the condition for making zero the energy of light reaching the resist film 212, namely, the condition for making the amplitude E zero, is obtained by using Formula 1, the ratio a is represented by the following Formula 2:

Formula 2:

$$a = \sqrt{\frac{\sqrt{T}}{1 + \sqrt{T}}}$$

In the case where, for example, the pattern exposure is conducted with a KrF excimer laser stepper (with the wavelength $\lambda$ of the exposing light of 0.248 μm) having the numerical aperture NA of 0.6 and the coherent ratio $\sigma$ of the exposing light of 0.75 used as the exposing light source and by using a phase shift mask having transmittance of 6% in the shield portion, in order to achieve the condition that the zero-order interference light alone can reach the resist film 212, the maximum pitch $p_{MAX}$ should be 0.24 μm.

Accordingly, the width d (=p×a) of the non-shield portion for attaining p=0.24 μm in Formula 2 is 0.11 μm in accordance with the following Formula 3:

Formula 3:

$$p \times a = 0.24 \times \sqrt{\frac{\sqrt{0.06}}{1 + \sqrt{0.06}}} \approx 0.11 \text{ (μm)}$$

In actual use, the accuracy in forming the phase shift mask region 201b is limited, and hence, the effective pitch $p_0$ of the shield portion is in the following range:

$$0.8\, p_{MAX} < p_0 < 1.2 p_{MAX}$$

Also, the condition for making zero the energy of the light reaching the resist film 212, namely, the condition for making the amplitude E zero, is obtained in Formula 1, but the energy of the light passing through the phase shift mask region 201b to reach the resist film 212 may not be zero. In other words, the amplitude E may be any value as far as the alignment accuracy determining mark 214 in a convex shape (i.e., the step portion in the periphery) can be formed in the resist film 212 owing to a difference in the energy between the light passing through the phase shift mask region 201b to reach the resist film 212 and the light passing through a peripheral portion of the phase shift mask region 201b to reach the resist film 212.

Although high processing accuracy is required in Embodiment 2 because it is necessary to form the phase shift mask region 201b with a fine pattern, the phase shift mask region 201b can be formed in the same procedure as the phase shift mask region formed in the main pattern region, and hence, the alignment mark part 201B can be formed without increasing the number of procedures.

Figure 5B:
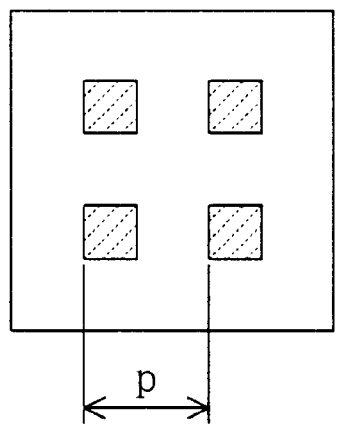
Figure 5C:
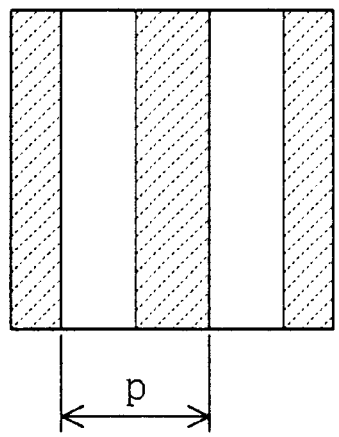

The phase shift mask region 201b can be in a pattern where the shield portions and the non-shield portions are alternately formed in the X and Y directions as is shown in FIG. 5(a); in a pattern where the shield portions are formed in the shape of dots as is shown in FIG. 5(b); or in a pattern where the shield portions and the non-shield portions are alternately formed as a line and space pattern.

Embodiment 3

A photomask according to Embodiment 3 will now be described with reference to FIGS. 6(a) through 6(d). In each of FIGS. 6(a) through 6(d), a portion on the right hand side of break lines corresponds to a main pattern region (element formation region) where line patterns and contact holes are to be formed, and a portion on the left hand side of the break lines corresponds to an alignment accuracy determining mark region where alignment accuracy determining marks are to be formed.

Figure 6A:
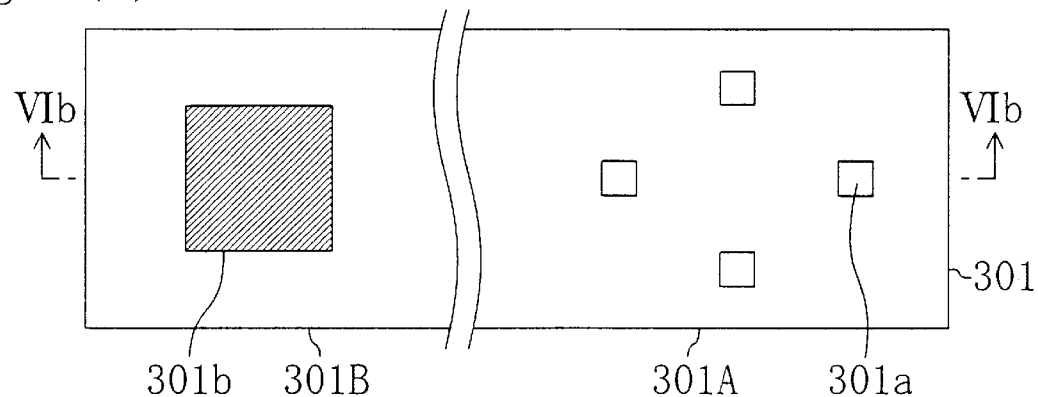
FIG. 6(a) is a plan view of a photomask according to Embodiment 3.
Figure 6B:
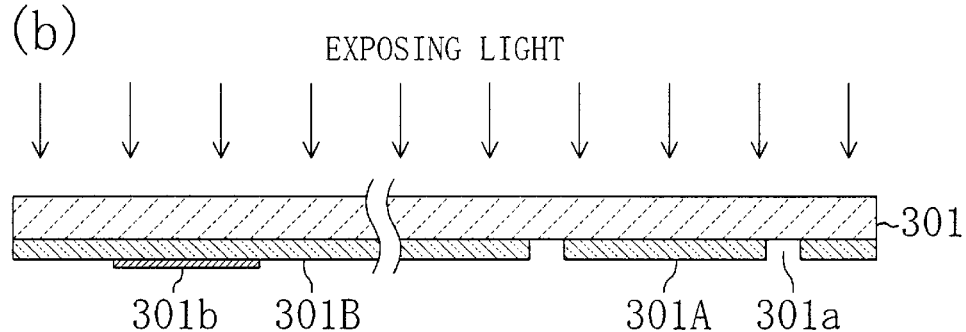
FIG. 6(b) is a sectional view taken on line VIb—VIb of FIG. 6(a)
Figure 6C:
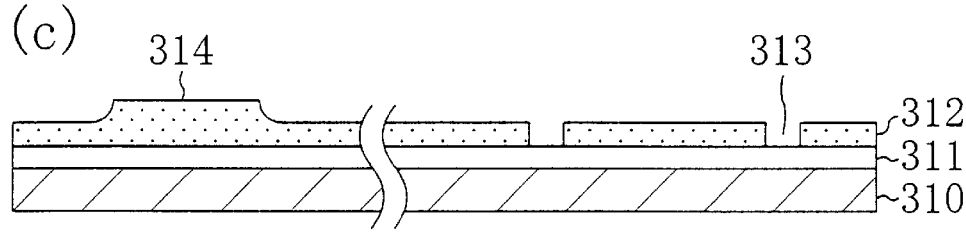
FIG. 6(c) is a sectional view of a resist pattern formed by using the photomask of Embodiment 3.
Figure 6D:
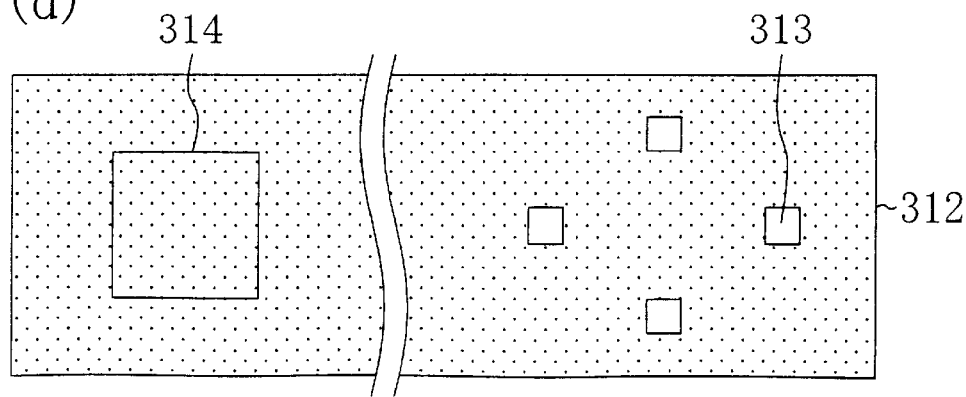
FIG. 6(d) is a plan view of the resist pattern formed by using the photomask of Embodiment 3.

FIG. 6(a) shows the plane structure of a photomask 301 of Embodiment 3, FIG. 6(b) shows the sectional structure taken on line VIb—VIb of FIG. 6(a), FIG. 6(c) shows the sectional structure of a resist pattern formed by using the photomask 301, and FIG. 6(d) shows the plane structure of the resist pattern formed by using the photomask 301.

The photomask 301 is made from a halftone type phase shift mask and, as is shown in FIGS. 6(a) and 6(b), includes a main pattern part 301A for forming a main pattern in a resist film and an alignment mark part 301B for forming, in the resist film through development, an alignment accuracy determining mark in a convex shape.

The main pattern part 301A and the alignment mark part 301B are made from a halftone type phase shift mask, a contact hole forming opening 301a for forming a contact hole in the resist film is formed in the main pattern part 301A and a shield film 301b is formed in the alignment mark part 301B. Although the contact hole forming opening 301a is formed in the main pattern part 301A in Embodiment 3, a line groove forming opening for forming a line groove can be formed instead.

As is shown in FIG. 6(c), a resist film 312 is formed on an etched film 311 deposited on a semiconductor substrate 310. The resist film 312 is irradiated with exposing light through the photomask 301 of Embodiment 3 for pattern exposure, and is developed after the pattern exposure. Thus, as is shown in FIGS. 6(c) and 6(d), a contact hole 313 is formed in the main pattern region of the resist film 312, and an alignment accuracy determining mark 314 in a convex shape having a step portion in the periphery is formed in the alignment accuracy determining mark region of the resist film 312.

Since the shield film 301b is formed on the halftone type phase shift mask in the alignment mark part 301B in Embodiment 3, the alignment accuracy determining mark 314 in a convex shape having a step portion in the periphery is formed in the alignment accuracy determining mark region of the resist film 312 on the basis of a difference in the energy between light passing through the shield film 301b and light passing through a peripheral portion of the shield film 301b.

Although the procedure for forming the shield film 301b is additionally conducted in Embodiment 3 as compared with Embodiment 2, high processing accuracy is not required because the shield film 301b is simply formed.

The shield film 301b may not completely shield light but may shield light to an extent that an alignment accuracy determining mark can be formed in a convex shape in the resist film 312 due to a difference in the energy between light passing through the shield film 301b to reach the resist film 312 and light passing through the peripheral portion of the shield film 301b to reach the resist film 312.

Embodiment 4

A method of determining alignment accuracy and a method of fabricating a semiconductor device by using the photomask of Embodiment 1 will now be described as Embodiment 4 with reference to FIGS. 7(a) through 7(c), 8(a) and 8(b).

Figure 7A:
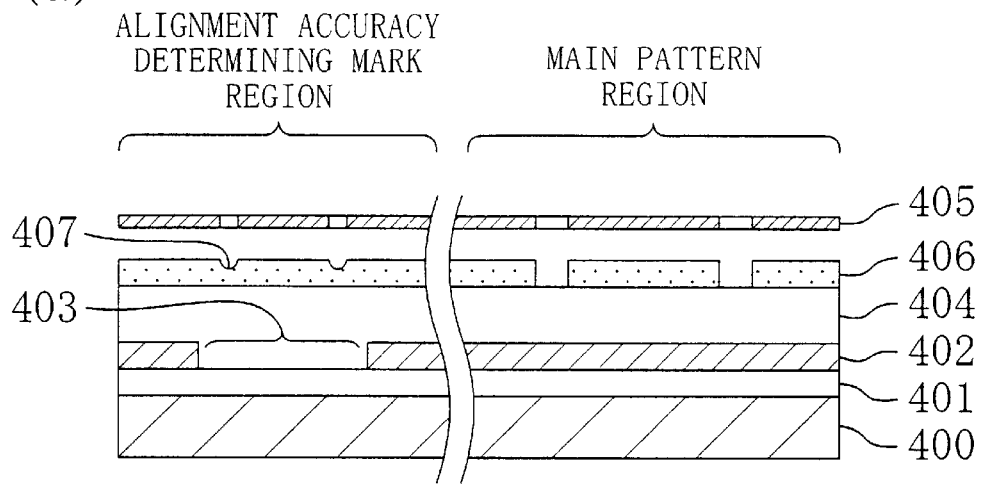
FIGS. 7(a) through 7(c) are sectional views for showing procedures in a method of determining alignment accuracy and a method of fabricating a semiconductor device according to Embodiment 4.

First, as is shown in FIG. 7(a), a line pattern 402 of a metal line or a gate electrode is formed on an underlying insulating film 401 formed on a semiconductor substrate 400. In this case, a first alignment accuracy determining mark 403 in a concave shape is formed in the line pattern 402.

Next, after depositing a lower interlayer insulating film 404 on the line pattern 402, a first resist film is formed on the lower interlayer insulating film 404. Thereafter, the first resist film is subjected to the pattern exposure using a photomask 405 according to Embodiment 1 and is then developed, thereby forming a first resist pattern 406. In this manner, a second alignment accuracy determining mark 407 in the shape of a rectangular frame-like concave groove smaller than the first alignment accuracy determining mark 403 is formed in a position corresponding to the first alignment accuracy determining mark 403 in the alignment accuracy determining mark region of the first resist pattern 406.

Figure 7B:
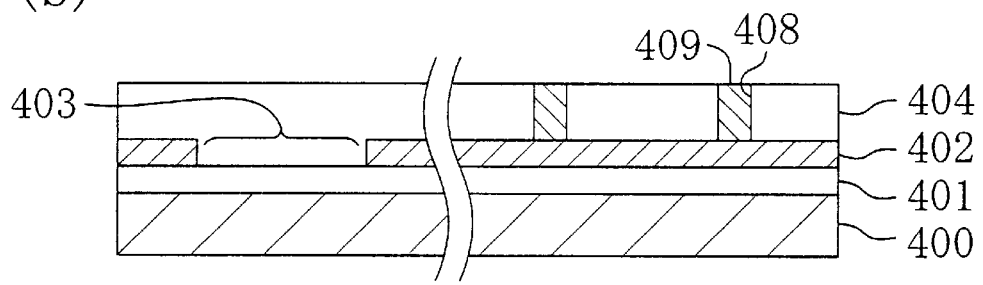

Then, alignment shift of the second alignment accuracy determining mark 407 from the first alignment accuracy determining mark 403 is measured with an optical measurement apparatus. When the alignment shift is determined to be within an allowable range, as is shown in FIG. 7(b), the lower interlayer insulating film 404 is etched by using the first resist pattern 406 as a mask, thereby forming a lower portion 408 of a contact hole in the lower interlayer insulating film 404. Then, the lower portion 408 of the contact hole is filled with a first metal film, thereby forming a contact lower portion 409. In this case, since no opening is formed in the lower interlayer insulating film 404 in the alignment accuracy determining mark region, the first metal film is not filled in any portion of the first alignment accuracy determining mark 403.

Figure 7C:
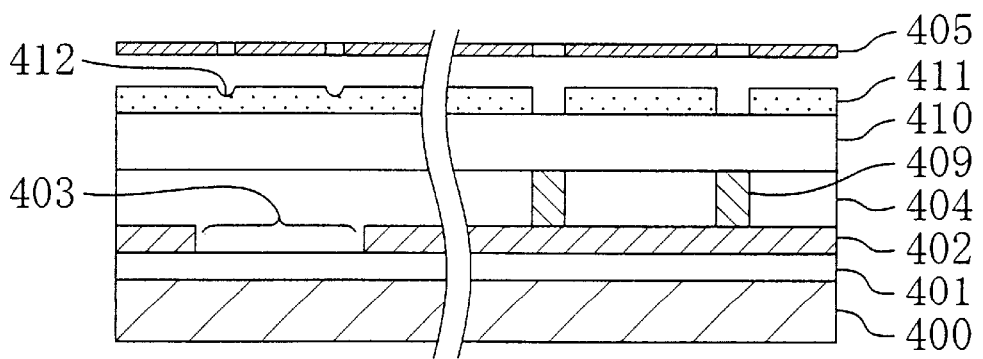

Next, as is shown in FIG. 7(c), an upper interlayer insulating film 410 is deposited on the lower interlayer insulating film 404, and a second resist film is formed on the upper interlayer insulating film 410. Thereafter, the second resist film is subjected to the pattern exposure using the same photomask 405 and is then developed, thereby forming a second resist pattern 411. In this manner, a third alignment accuracy determining mark 412 in the shape of a rectangular frame-like concave groove smaller than the first alignment accuracy determining mark 403 is formed in a position corresponding to the first alignment accuracy determining mark 403 in the alignment accuracy determining mark region of the second resist pattern 411.

Figure 8A:
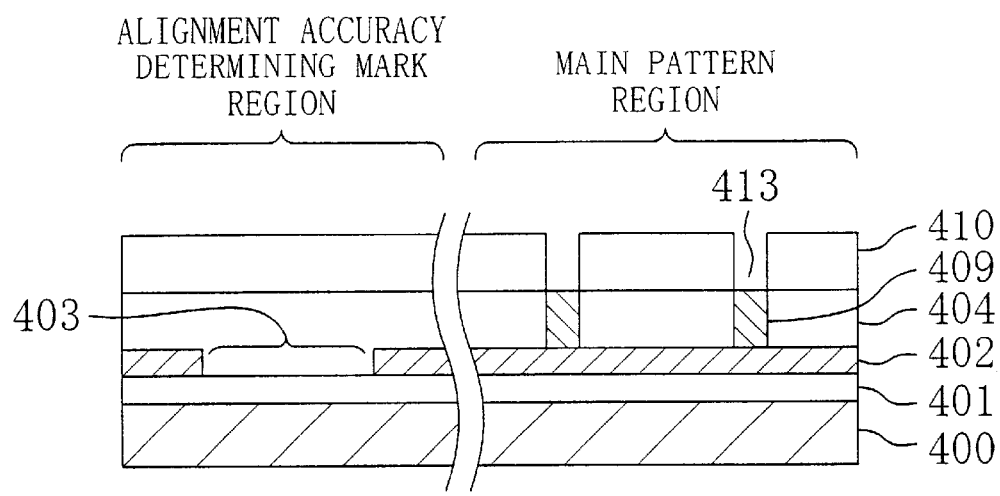
FIGS. 8(a) and 8(b) are sectional views for showing other procedures in the method of determining alignment accuracy and the method of fabricating a semiconductor device of Embodiment 4.

Then, alignment shift of the third alignment accuracy determining mark 412 from the first alignment accuracy determining mark 403 is measured with an optical measurement apparatus. When the alignment shift is determined to be within an allowable range, the upper interlayer insulating film 410 is etched by using the second resist pattern 411 as a mask, thereby forming an upper portion 413 of the contact hole in the upper interlayer insulating film 410 as is shown in FIG. 8(a).

Figure 8B:
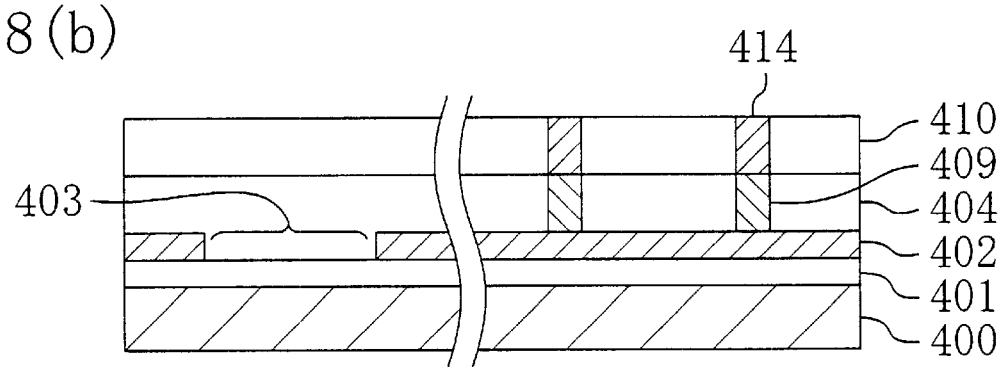

Next, the upper portion 413 of the contact hole is filled with a second metal film, so that a contact upper portion 414 can be formed as is shown in FIG. 8(b). In this manner, a contact with a very high aspect ratio can be definitely formed from the contact lower portion 409 and the contact upper portion 414.

In Embodiment 4, the second alignment accuracy determining mark 407 in the shape of a concave groove not penetrating the first resist pattern 406 is formed in the alignment accuracy determining mark region of the first resist pattern 406. Therefore, no opening is formed in the lower interlayer insulating film 404 in the alignment accuracy determining mark region, and hence, the first metal film is not filled in any portion of the first alignment accuracy determining mark 403. Accordingly, even after depositing the first metal film, the first alignment accuracy determining mark 403 can be recognized with an optical measurement apparatus, so that the alignment shift of the third alignment accuracy determining mark 412 from the first alignment accuracy determining mark 403 can be optically measured.

Furthermore, since the third alignment accuracy determining mark 412 in the shape of a concave groove not penetrating the second resist pattern 411 is formed in the alignment accuracy determining mark region, no opening is formed in the upper interlayer insulating film 410. Therefore, in the procedure for forming the contact upper portion 414 by depositing the second metal film, the second metal film is not filled in any portion of the first alignment accuracy determining mark 403. Accordingly, the first alignment accuracy determining mark 403 can be used again for forming a resist pattern having a different pattern shape on the upper interlayer insulating film 404 by using a photomask different from the photomask 405.

Although the photomask of Embodiment 1 is used in Embodiment 4, the photomask according to Embodiment 2 or 3 can be used instead.

Embodiment 5

A method of determining alignment accuracy and a method of fabricating a semiconductor device by using the photomask of Embodiment 1 will now be described as Embodiment 5 with reference to FIGS. 9(a) through 9(c) and 10(a) through 10(c).

Figure 9A:
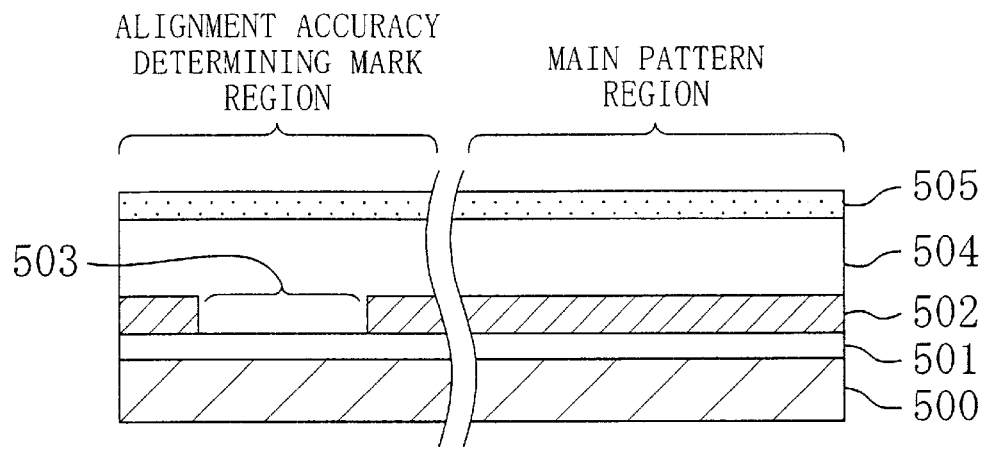
FIGS. 9(a) through 9(c) are sectional views for showing procedures in a method of determining alignment accuracy and a method of fabricating a semiconductor device according to Embodiment 5.

First, as is shown in FIG. 9(a), a line pattern 502 of a metal line or a gate electrode is formed on an underlying insulating film 501 formed on a semiconductor substrate 500. In this case, a first alignment accuracy determining mark 503 in a concave shape is formed in the line pattern 502. Thereafter, a lower interlayer insulating film 504 is formed on the line pattern 502, and a first resist film 505 is formed on the lower interlayer insulating film 504.

Figure 9B:
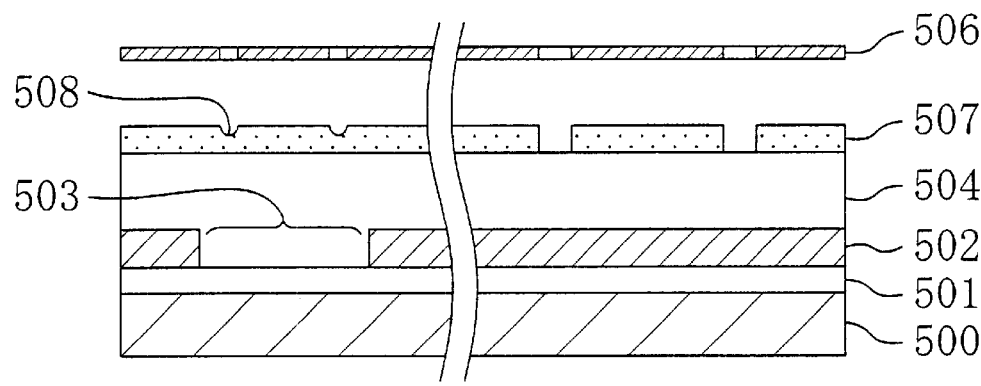

Next, as is shown in FIG. 9(b), the first resist film 505 is subjected to pattern exposure by using a photomask 506 according to Embodiment 1 having a contact hole forming opening in the main pattern region and is then developed, thereby forming a first resist pattern 507 from the first resist film 505. In this manner, a second alignment accuracy determining mark 508 in the shape of a rectangular frame-like concave groove smaller than the first alignment accuracy determining mark 503 is formed in a position corresponding to the first alignment accuracy determining mark 503 in the alignment accuracy determining mark region of the first resist pattern 507.

Figure 9C:
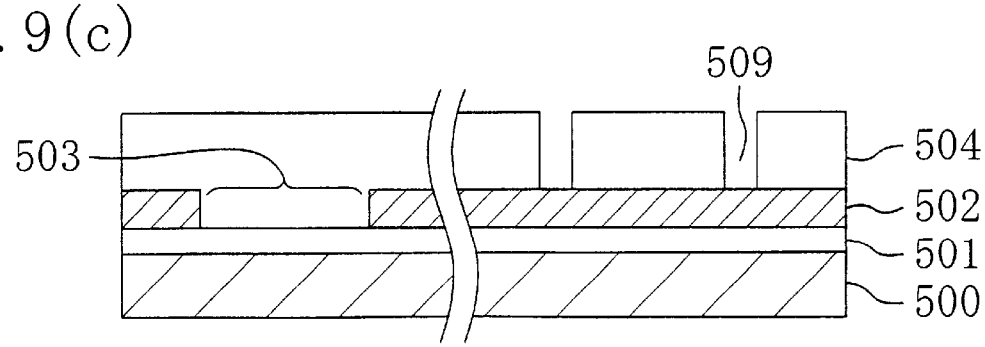

Then, alignment shift of the second alignment accuracy determining mark 508 from the first alignment accuracy determining mark 503 is measured with an optical measurement apparatus. When the alignment shift is determined to be within an allowable range, the lower interlayer insulating film 504 is etched by using the first resist pattern 507 as a mask, thereby forming a contact hole 509 in the lower interlayer insulating film 504 as is shown in FIG. 9(c).

Figure 10A:
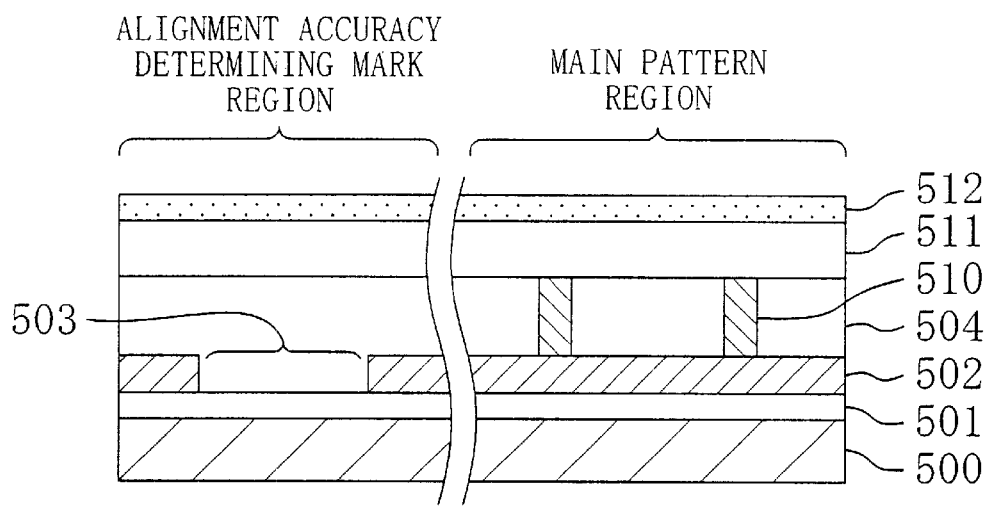
FIGS. 10(a) through 10(c) are sectional views for showing other procedures in the method of determining alignment accuracy and the method of fabricating a semiconductor device of Embodiment 5.

Next, as is shown in FIG. 10(a), the contact hole 509 is filled with a first metal film, thereby forming a contact 510. In this case, since no opening is formed in the lower interlayer insulating film 504 in the alignment accuracy determining mark region, the first metal film is not filled in any portion of the first alignment accuracy determining mark 503. Next, an upper interlayer insulating film 511 of a different material from the lower interlayer insulating film 504, namely, a material having etch selectivity against the lower interlayer insulating film 504, is deposited on the lower interlayer insulating film 504, and a second resist film 512 is formed on the upper interlayer insulating film 511. In the case where the upper interlayer insulating film 511 is made from the same material as the lower interlayer insulating film 504, an etch-stop film is disposed between the lower interlayer insulating film 504 and the upper interlayer insulating film 511.

Figure 10B:
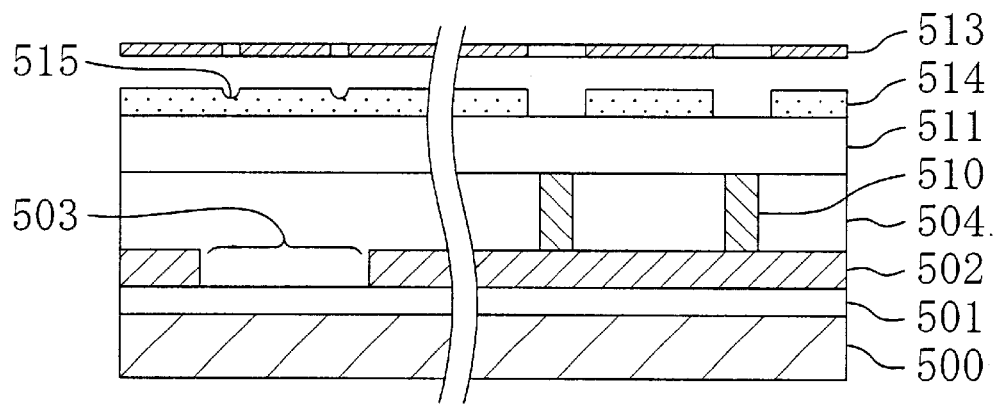

Then, as is shown in FIG. 10(b), the second resist film 512 is subjected to pattern exposure by using a photomask 513 according to Embodiment 1 having a line groove forming opening in the main pattern region and is then developed, thereby forming a second resist pattern 514 from the second resist film 512. In this manner, a third alignment accuracy determining mark 515 in the shape of a rectangular frame-like concave groove smaller than the first alignment accuracy determining mark 503 is formed in a position corresponding to the first alignment accuracy determining mark 503 in the alignment accuracy determining mark region of the second resist pattern 514.

Figure 10C:
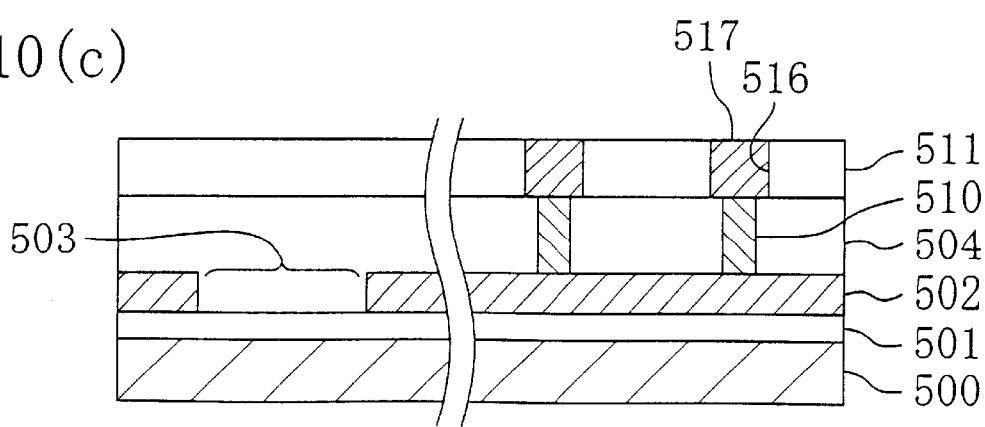
Figure 11A:
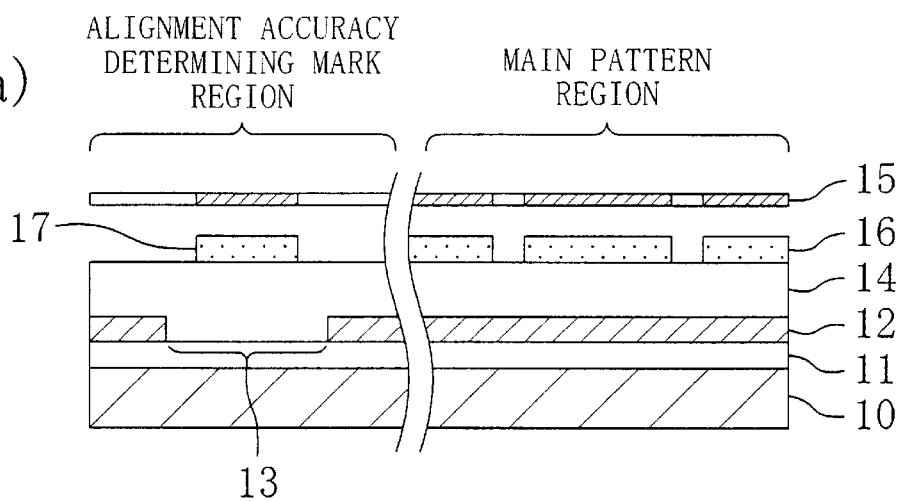
FIGS. 11(a) and 11(c) are sect al views for showing procedures in a first conventional method of fabricating a semiconductor device and FIG. 11(b) is a plan view for illustrating a method of determining alignment shift in the first conventional method of fabricating a semiconductor device.
Figure 11B:
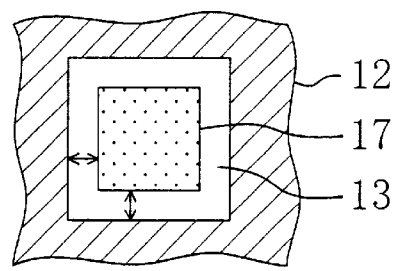
Figure 11C:
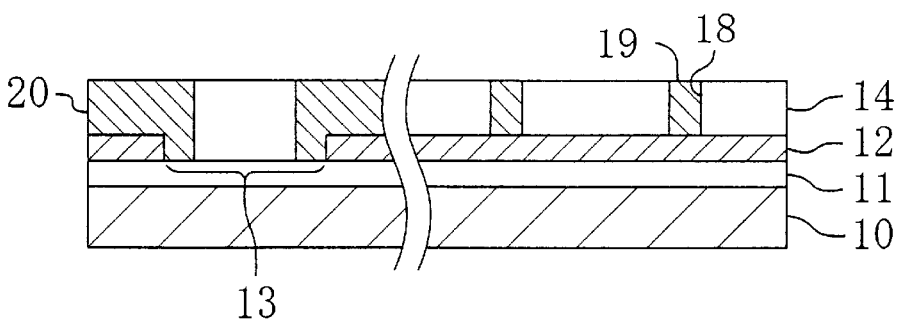
Figure 12A:
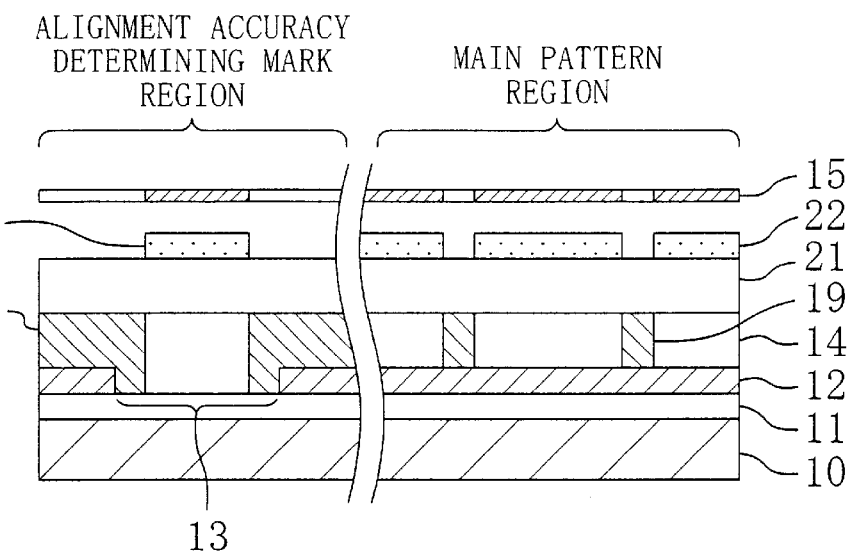
FIGS. 12(a) through 12(c) are sectional views for showing procedures in the first conventional method of fabricating a semiconductor device.
Figure 12B:
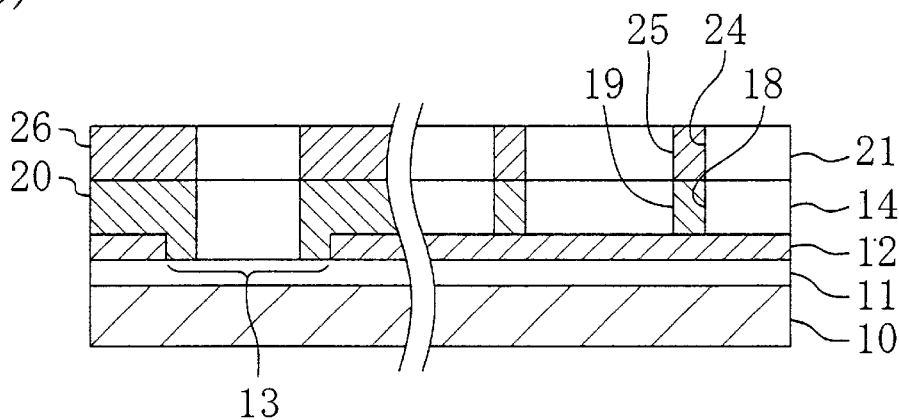
Figure 12C:
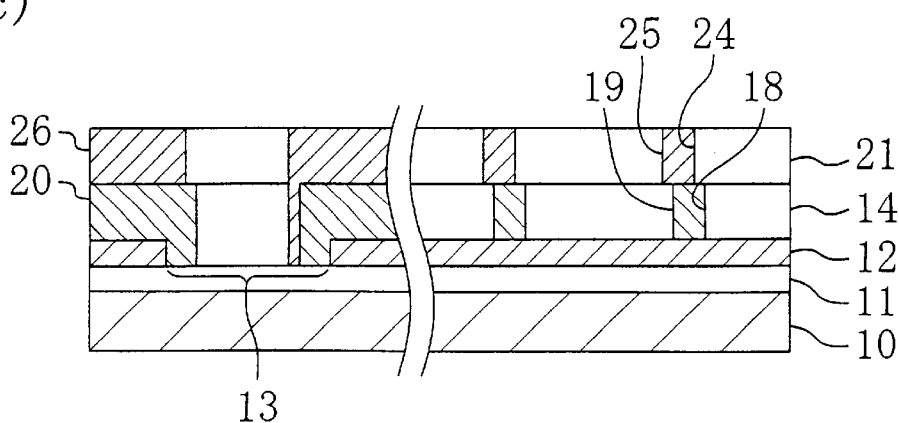
Figure 13A:
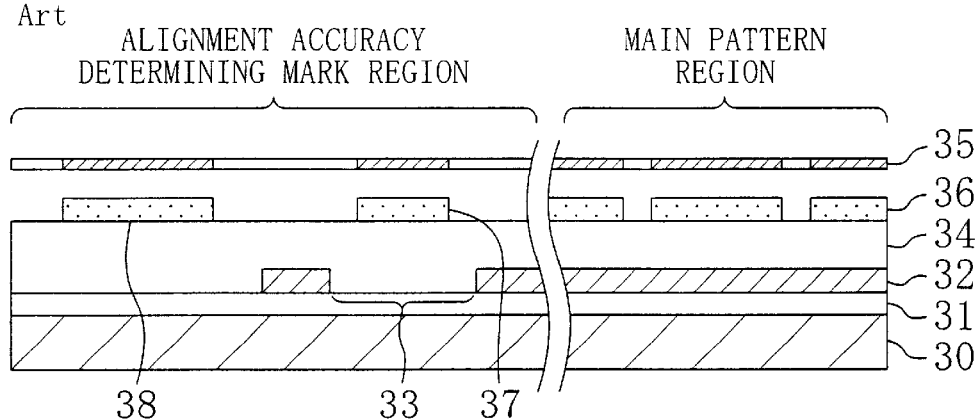
FIGS. 13(a) through 13(d) are sectional views for showing procedures in a second conventional method of fabricating a semiconductor device.
Figure 13B:
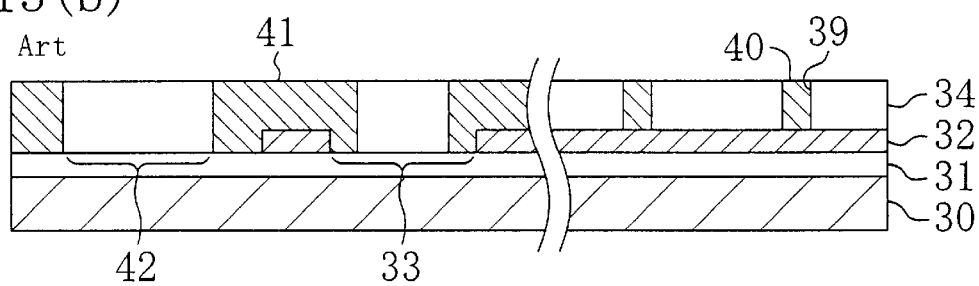
Figure 13C:
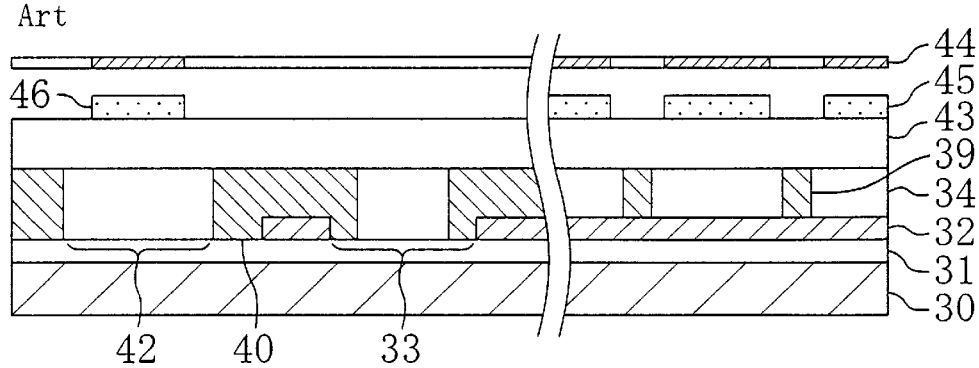
Figure 13D:
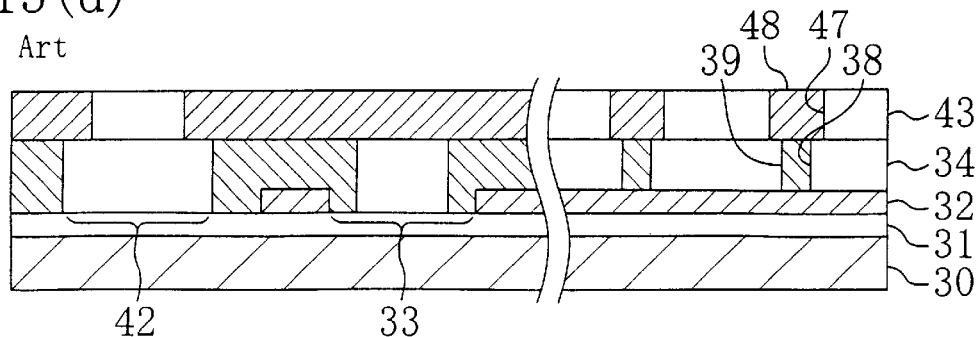

Next, alignment shift of the third alignment accuracy determining mark 515 from the first alignment accuracy determining mark 503 is measured with an optical measurement apparatus. When the alignment shift is determined to be within an allowable range, the upper interlayer insulating film 511 is etched by using the second resist pattern 514 as a mask, thereby forming a line groove 516 in the upper interlayer insulating film 511 as is shown in FIG. 10(c). Then, the line groove 516 is filled with a second metal film, thereby forming a buried line 517. In this manner a line having a damascene structure can be definitely formed.

Since the second alignment accuracy determining mark 508 in the shape of a concave groove not penetrating the first resist pattern 507 is formed in the alignment accuracy determining mark region of the first resist pattern 507 in Embodiment 5, no opening is formed in the lower interlayer insulating film 504 in the alignment accuracy determining mark region. Therefore, the first alignment accuracy determining mark 503 is not filled with the first metal film. Accordingly, even after depositing the first metal film, the first alignment accuracy determining mark 503 can be recognized with an optical measurement apparatus, and hence, the alignment shift of the third alignment accuracy determining mark 515 from the first alignment accuracy determining mark 503 can be optically measured.

Furthermore, since the third alignment accuracy determining mark 515 in the shape of a concave groove not penetrating the second resist pattern 514 is formed in the alignment accuracy determining mark region, no opening is formed in the upper interlayer insulating film 511. Therefore, in the procedure for forming the buried line 517 by depositing the second metal film, the first alignment accuracy determining mark 503 is not filled with the second metal film. Accordingly, the first alignment accuracy determining mark 503 can be used again in forming a resist pattern having a different pattern shape on the upper interlayer insulating film 511 by using a third photomask.

Although the photomask of Embodiment 1 is used in Embodiment 5, the photomask according to Embodiment 2 or 3 can be used instead.

What is claimed is:

1. A resist pattern formation method comprising the steps of:
    forming a first alignment accuracy determining mark in an alignment mark forming region of a conductive film deposited on a substrate having an element formation region and the alignment mark forming region;
    forming a resist film on an insulating film formed on the conductive film; and
    forming a main pattern in the element formation region of the resist film and a second alignment accuracy determining mark, in section not penetrating the resist film, in a portion corresponding to the first alignment accuracy determining mark of the resist film, by irradiating the resist film with an exposing light through a photomask.

2. The resist pattern formation method of claim 1,
    wherein the second alignment accuracy determining mark is a concave portion formed in the resist film.

3. The resist pattern formation method of claim 2,
    wherein the concave portion is formed by using a fine opening pattern, having an opening width smaller than a resolution limit of the exposing light and being formed by the photomask.

4. The resist pattern formation method of claim 1,
    wherein the second alignment accuracy determining mark is a protruding step portion formed on the resist film.

5. The resist pattern formation method of claim 4,
    wherein the photomask is a halftone type phase shift mask having a phase shift mask region, where non-shield portions for transmitting the exposing light with no attenuation and causing no phase difference and shield portions for transmitting the exposing light with attenuation and causing phase inversion are alternatively formed, and wherein the protruding step portion is formed on the basis of a difference in energy between a first light passing through the phase shift mask region and a second light passing through a peripheral portion of the phase shift mask region.

6. The resist pattern formation method of claim 4, wherein the photomask is a halftone type phase shift mask having a shield region, and wherein the protruding step portion is formed on the basis of the difference in energy between a first light passing through the shield region and a second light passing through a peripheral portion of the shield region.

* * * * *